United States Patent [19]

Niehaus et al.

[11] 4,196,439

[45] Apr. 1, 1980

[54] SEMICONDUCTOR DEVICE DRAIN CONTACT CONFIGURATION

[75] Inventors: William C. Niehaus, Murray Hill; Stuart H. Wemple, Chatham Township, Morris County, both of N.J.

[73] Assignee: Bell Telephone Laboratories, Incorporated, Murray Hill, N.J.

[21] Appl. No.: 921,585

[22] Filed: Jul. 3, 1978

[51] Int. Cl.$^2$ .............................................. H01L 29/80
[52] U.S. Cl. ........................................ 357/22; 357/15
[58] Field of Search .................................... 357/22, 15

[56] References Cited

U.S. PATENT DOCUMENTS 4,143,386  3/1979  Kaiser ................................. 357/22

OTHER PUBLICATIONS

IEEE Trans. on Electron Devices, vol. ED-25 No. 6, Jun. 1978, Furutsuka et al.

*Primary Examiner*—Edward J. Wojciechowicz
*Attorney, Agent, or Firm*—Peter V. D. Wilde; Peter A. Businger

[57] ABSTRACT

Disclosed are unipolar semiconductor devices such as, e.g., metal-semiconductor field effect transistors. The disclosed devices comprise an n- or p-type active layer on a substrate and a drain contact on the active layer.

The active layer comprises two contiguous regions, namely a first, more heavily doped region which is in contact with the drain contact and a second, less heavily doped region which in a direction perpendicular to the active layer extends through the remainder of the active layer. In the disclosed configuration the more heavily doped region extends past the edge of the drain contact towards a source of free carriers such as e.g., a source contact.

Devices incorporating such configuration of regions in the active layer are more resistant to burnout and are capable of operating at higher voltage and power levels.

13 Claims, 1 Drawing Figure

U.S. Patent  Apr. 1, 1980  4,196,439
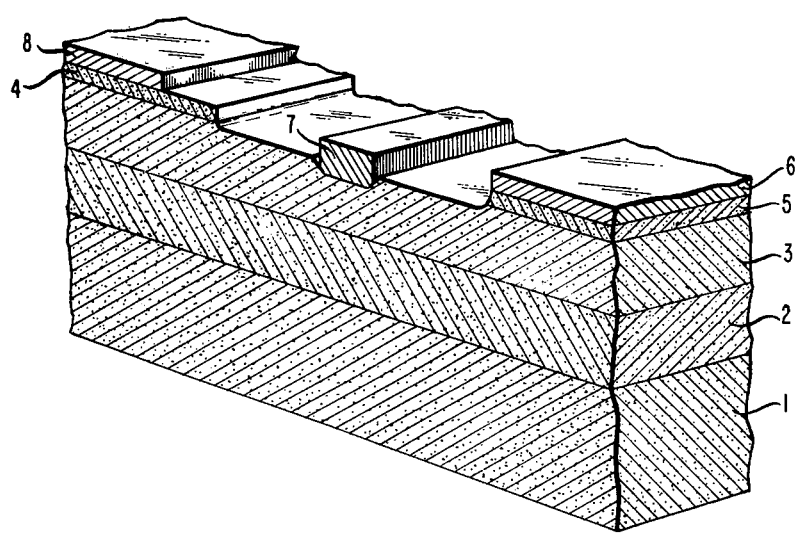

SEMICONDUCTOR DEVICE DRAIN CONTACT CONFIGURATION

BACKGROUND OF THE INVENTION

1. Field of the Invention

The invention is concerned with semiconductor devices.

2. Description of the Prior Art

Semiconductor devices are commercially well established as active components in computing and communication equipment where they may serve, e.g., as gates and switches and as sources, modulators, and amplifiers of radio frequency electromagnetic radiation. Semiconductor devices are being developed also for serving similar functions in optical communications as exemplified by devices such as laser diodes and phototransistors described in the book by A. A. Bergh and P. J. Dean, "Light Emitting Diodes," Clarendon Press, 1976.

Among semiconductor devices for radio frequency application are devices generally known as metal-semiconductor field effect transistors (MESFETs for short) which are being used, e.g., as microwave amplifiers on account of their capability to operate at relatively high frequencies and power levels and their low noise output. The basic structure of MESFETs is well known in the art of semiconductor devices and is described, e.g., in the book by S. M. Sze, "Physics of Semiconductor Devices", Wiley-Interscience, 1969. Specifically, on page 411 of the book by Sze, a basic device structure is shown to encompass a semi-insulating substrate on which an n-type semiconducting epitaxial layer is deposited. Three contacts are deposited on the semiconducting layer, namely a first ohmic contact acting as a negative source contact, a Schottky barrier contact acting as a gate contact, and a second ohmic contact acting as a positive drain contact.

A more elaborate device structure is disclosed in the papers by M. Fukuta et al., "Power GaAs MESFET with a High Drain-Source Breakdown Voltage", *IEEE Transactions on Microwave Theory and Techniques*, Volume MTT-24, No. 6, June 1976, pages 312–317 and by S. H. Wemple and W. C. Niehaus, "Source-Drain Burn-Out in GaAs MESFETs", *Inst. Phys. Conf.* Ser. No. 33b, 1977, pages 262–270. These papers are concerned primarily with an undesirable phenomenon known as burnout which may occur in MESFETs at elevated source-drain voltage levels and which results in irreversible electrical breakdown of a device. Usually, burnout is accompanied by microscopically visible damage at the drain contact edge.

The n-type MESFET structure disclosed by the above-cited papers encompasses a more highly doped $n^+$-type epitaxial layer located between the n-type epitaxial layer and the ohmic contacts. This structure was found to reduce the risk of burnout and to enable devices to operate at higher source-drain voltage levels. For example, while burnout was observed at approximately 10 volts in a first type of devices not equipped with the $n^+$-layer, burnout occurred at approximately 20 volts in a second type of devices identical to the first except for the presence of an $n^+$-layer.

While it is possible, of course, to achieve higher power levels by using elongated electrodes and by operating several devices in parallel, improved design of individual devices and, in particular, improved cross-sectional design are desirable for economic reasons. Moreover, improved design of MESFETs yields benefits such as enhanced gain and linearity.

SUMMARY OF THE INVENTION

The invention is a unipolar semiconductor device which comprises an n- or p-type active layer on a substrate and a drain contact on the active layer.

The active layer comprises two contiguous regions, namely a first, more heavily doped region which is in contact with at least a portion of the drain contact, and a second, less heavily doped region which in a direction perpendicular to the active layer extends through the remainder of the active layer. In the new configuration the more heavily doped first region extends past the edge of the drain contact towards a source of free carriers such as, e.g., a source contact. As a consequence of such configuration of regions, the device is more resistant to burnout and is capable of operating at higher voltage and power levels.

BRIEF DESCRIPTION OF THE DRAWING

The FIGURE shows in perspective and partly in cross section a metal-semiconductor field effect transistor having a drain configuration which is designed for resistance to burnout at elevated source-drain voltage.

DETAILED DESCRIPTION

Devices of the invention comprise an active layer of a semiconductor material which is supported by a substrate and which has extrinsic properties due to net doping with an appropriate impurity. A drain contact is deposited on the active layer. The active layer comprises two contiguous regions, namely a first, more heavily doped $n^+$- or $p^+$-type region which is in contact with at least a portion of the drain contact and which extends from the first region towards the substrate through the active layer. The more heavily doped first region extends past the edge of the drain contact towards a source of free carriers such as, e.g., a source contact. Devices may also comprise a gate contact on the active layer.

The FIGURE shows semi-insulating substrate 1, semiconducting buffer layer 2, a semiconducting active layer which consists of n-type region 3 and $n^+$-type regions 4 and 5, source contact 6, gate contact 7, and drain contact 8. $N^+$-region 4 may be generally distinguished from n-region 3 on the basis of dopant concentration. Specifically, $n^+$-region 4 may be defined as such portion of the active layer in which the net dopant concentration per $cm^2$ as well as per $cm^3$ significantly exceeds, preferably by a factor of at least 1.5, the net dopant concentration in the n-region.

Substrate, buffer layer, and active layer may be made, e.g., of appropriately doped GaAs. Specifically, substrate 1 is preferably doped with a dopant such as, e.g., Cr so as to result in a sheet resistance not less than approximately $10^7$ Ohm cm. Buffer layer 2 is required to have substantially greater resistivity than region 3. Region 3 may consist of GaAs, doped lightly with an appropriate impurity such as, e.g., S, Se, or Sn and preferably so as to result in a net dopant concentration of $10^{16}$ to $3 \times 10^{17}$ per $cm^3$. Regions 4 and 5 may consist of GaAs, doped at least as heavily as region 3 and preferably so as to result in a net dopant concentration of $10^{16}$ to $10^{20}$ per $cm^3$. Ohmic contacts 6 and 8 may be layers of Ag-Au-Ge, Ni-Au-Ge, or any other suitable ohmic contact material. Gate contact 7 consists of a suitable gate metal such as, e.g., aluminum.

The FIGURE shows n+-region 4 to extend beyond the edge of drain contact 8, a configuration which is an essential feature of disclosed semiconductor devices. Effectiveness of such configuration for allowing increased source-drain voltage and for enhancing power handling capability of planar unipolar semiconductor devices may be explained in terms of a physical mechanism according to which burnout in n-type devices occurs as follows: As a result of an imperfect drain ohmic contact, holes are injected into the semi-insulating substrate at points underlying the drain ohmic contact layer edge. The presence of such holes causes increased electron current in the substrate or in the buffer layer which, in turn, initiates the burnout sequence of heating, thermal runaway, and catastrophic melting at the drain contact edge. If the n+-region extends beyond the drain contact edge by a preferred distance which is at least as great as the thickness of the active layer, a path is provided for electron current to flow out of the n-region and into the n+-region at points not underlying the drain contact. As a consequence, little or no electron current flows past the drain contact edge in the n-region or the substrate, and heating and thermal runaway are circumvented.

Analogously, in the case of p-type devices, burnout is initiated by injection of electrons into the semi-insulating substrate due to imperfect drain ohmic contact. Risk of burnout is reduced in this case by an analogous structure in which a p+-region extends beyond the drain contact edge.

The configuration of n- and n+-regions shown in the figure may be produced, e.g., by depositing distinct layers followed by etching to produce a stepped profile. A stepped profile may also be used when dopant concentration changes gradually in the active layer from a relatively light concentration at the substrate or buffer layer to a relatively heavy concentration at the drain contact. Furthermore, instead of exhibiting a sharply delineated step, the profile may take the form of a rounded shoulder, of a slope, or of a variety of intermediate or similar shapes. Finally, a more heavily doped region in contact with and extending beyond the edge of a drain contact may be embedded in an active layer having essentially uniform thickness. Such latter structure may be conveniently produced, e.g., by ion implantation of a dopant element.

In addition to being applicable to GaAs MESFETs, the disclosed configuration may be utilized in InP and other III-V MESFETs, JFETs (junction field effect transistors), and MOSFETs (metal-oxide field effect transistors), the latter being described in the book by Sze cited above. More generally, a more heavily doped region underlying a drain contact and extending towards a source of free carriers may be beneficially incorporated in any unipolar semiconductor device.

The structure shown in the FIGURE may conveniently be produced, e.g., on a gold plated sheet of copper which acts as a heat sink during device operation. Deposition of layers of doped and undoped semiconductor material may conveniently be accomplished by well-known techniques such as chemical vapor deposition, liquid phase epitaxy, molecular beam epitaxy, and ion implantation, either alone or in combination. Metallic layers are typically deposited by evaporation and may be reinforced by plating.

Devices may be protected from atmospheric contamination by a coating of, e.g., $SiO_2$ or $Si_3N_4$ which may be deposited, e.g., by chemical vapor deposition or by sputtering.

Typical MESFET dimensions are a substrate thickness of 1–2 mils, a buffer layer thickness of 2–15 micrometers, an n-region thickness of 0.2–0.7 micrometers, an n+-region thickness of 0.1–0.4 micrometers, an ohmic contact thickness of 0.5–5 micrometers and a gate contact thickness of 0.5–1 micrometers.

Design of MESFETs and other unipolar devices embodying the disclosed drain contact configuration may vary to a considerable extent. For example, the groove in the intermediate layer in which the gate electrode is deposited according to the FIGURE enhances adhesion of the gate electrode to the intermediate layer and facilitates stripping of mask material once evaporation of aluminum is completed. However, operation of the device does not depend on the presence of such groove. Similarly, there is considerable latitude of source contact configuration and, in particular, manufacture of the device may be facilitated if the edge of source contact 6 is recessed from the edge of region 5.

EXAMPLE

Sulfur doped GaAs MESFETs were fabricated by chemical vapor deposition in a quartz tube on a chromium doped GaAs substrate. Arsenic trichloride gas was passed through the tube in which the substrate was placed downstream of a boat carrying metallic gallium. The substrate was maintained at a temperature of 700 degrees C. and the boat at a temperature of 800 degrees C. A mixture of hydrogen and hydrogen sulfide gases was leaked into the tube at a point between the boat and the substrate, differentiation of buffer layer, n-, and n+-regions being effected during deposition by simple adjustment of the leak valve. Deposition proceeded at a nominally constant rate of approximately 0.2 micrometers per minute. Nominal layer thickness for buffer layer, n-region, and n+-region was 3.0, 0.4, and 0.2 micrometers, respectively. Nominal dopant concentrations for n- and n+-regions were $8 \times 10^{16}$ and $2 \times 10^{18}$ per $cm^3$, respectively. Au-Ge-Ag source and drain contacts were deposited 8 micrometers apart in the presence of a mask. After stripping of the mask, a second mask was applied, covering the deposited metallic contact layers and extending 2 micrometers beyond the drain contact edge. The active layer was etched while a voltage was applied between the electrodes, etching being carried out until the current flowing between the electrodes had reached a desired level. A third mask was applied for etching a trough 2 micrometers long in which the Al gate contact layer was deposited by evaporation. The mask was stripped and a fourth mask was deposited leaving only metallic contact areas exposed to allow reinforcing with Ti-Pt-Au.

Devices were tested by applying increasing DC voltages between source and drain contact until burnout occurred. Measured burnout voltages at a typical source-drain bias current of 100 mA per mm were in the range of 35–45 Volts, in contrast to voltages of about 20 Volts measured on devices in which the ohmic drain contact edge was not recessed from the edge of the intermediate layer. Voltages as high as 58 Volts were observed in cases of 25 mA per mm source-drain current.

We claim:

1. Article of manufacture comprising at least one substrate supported device, said device comprising (a)

an active layer consisting essentially of a semiconductor material having extrinsic properties due to a net doping level, (b) a drain contact on a first surface portion of said active layer, said active layer comprising (1) a first region which is in contact with at least a portion of said drain contact and (2) a second region which, in a direction perpendicular to said active layer, extends from said first region through the remainder of said active layer, net doping level being less in said second region than in said first region, and (c) means for providing said second region with free carriers at a point beyond the edge of said drain contact CHARACTERIZED IN THAT said first region extends, in a direction parallel to said active layer, beyond said edge towards said point for a distance which is at least equal to the thickness of said active layer measured at said edge.

2. Device of claim 1 in which net doping level in said second region is in the range of $10^{16}$ to $3 \times 10^{17}$ per $cm^3$.

3. Device of claim 1 in which net doping level in said first region is in the range of $10^{16}$ to $10^{20}$ per $cm^3$.

4. Device of claim 1 in which net doping level per $cm^2$ in said first region is at least 1.5 times as great as net doping level per $cm^2$ in said second region and in which net doping level per $cm^3$ in said first region is at least 1.5 times as great as net doping level per $cm^3$ in said second region.

5. Device of claim 1 in which a buffer layer is interposed between said substrate and said active layer.

6. Device of claim 1 in which said second region is epitaxial.

7. Device of claim 6 in which said first region is epitaxial.

8. Device of claim 1 in which said means is a source contact on a second surface portion of said active layer.

9. Device of claim 8 in which said active layer comprises a third region which is in contact with said source contact and in which net doping level is greater than in said second region.

10. Device of claim 9 in which said third region extends beyond the edge of said source contact towards said drain contact.

11. Device of claim 9 in which said third region is epitaxial.

12. Device of claim 8 in which said device comprises a gate electrode on a third surface portion of said active layer.

13. Device of claim 1 in which a doping level has been achieved in said active layer by ion implantation.

* * * * *